(12) United States Patent
Enomoto et al.

(10) Patent No.: US 10,520,831 B2
(45) Date of Patent: Dec. 31, 2019

(54) SUBSTRATE PROCESSING METHOD, SUBSTRATE PROCESSING SYSTEM AND SUBSTRATE PROCESSING APPARATUS

(71) Applicant: Tokyo Electron Limited, Tokyo (JP)

(72) Inventors: Masashi Enomoto, Koshi (JP); Yoshihiro Kondo, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 123 days.

(21) Appl. No.: 15/565,714

(22) PCT Filed: Mar. 28, 2016

(86) PCT No.: PCT/JP2016/059808
§ 371 (c)(1),
(2) Date: Oct. 11, 2017

(87) PCT Pub. No.: WO2016/167105
PCT Pub. Date: Oct. 20, 2016

(65) Prior Publication Data
US 2018/0076066 A1   Mar. 15, 2018

(30) Foreign Application Priority Data

Apr. 16, 2015 (JP) ................................ 2015-084406
Jan. 25, 2016 (JP) ................................ 2016-011544

(51) Int. Cl.
*G03F 7/20* (2006.01)
*H01L 21/67* (2006.01)
*H01L 21/677* (2006.01)
*H01L 21/687* (2006.01)

(52) U.S. Cl.
CPC ........ *G03F 7/70558* (2013.01); *G03F 7/7075* (2013.01); *G03F 7/70625* (2013.01); *G03F 7/70875* (2013.01); *G03F 7/70991* (2013.01); *H01L 21/6715* (2013.01); *H01L 21/67109* (2013.01); *H01L 21/67225* (2013.01); *H01L 21/67253* (2013.01); *H01L 21/67727* (2013.01); *H01L 21/67733* (2013.01); *H01L 21/67745* (2013.01); *H01L 21/67748* (2013.01); *H01L 21/68742* (2013.01)

(58) Field of Classification Search
CPC ............. G03F 7/70558; G03F 7/70625; G03F 7/7075; G03F 7/70875; G03F 7/70991; H01L 21/67109; H01L 21/6715; H01L 21/67225; H01L 21/67253; H01L 21/67727; H01L 21/67733; H01L 21/67745; H01L 21/67748; H01L 21/68742
USPC .................................................... 430/30, 330
See application file for complete search history.

(56) References Cited

U.S. PATENT DOCUMENTS

| | | |
|---|---|---|
| 2002/0009657 A1 | 1/2002 | Ikuno et al. |
| 2003/0164932 A1 | 9/2003 | Ikuno et al. |
| 2009/0185151 A1 | 7/2009 | Yamamoto et al. |

FOREIGN PATENT DOCUMENTS

| | | |
|---|---|---|
| JP | 08-172046 A1 | 7/1996 |
| JP | 11-030868 A1 | 2/1999 |
| JP | 2001-338865 A1 | 12/2001 |
| JP | 2002-214802 A1 | 7/2002 |
| JP | 2007-101738 A1 | 4/2007 |
| JP | 2007-335626 A1 | 12/2007 |
| JP | 2011-204774 A1 | 10/2011 |

OTHER PUBLICATIONS

International Search Report and Written Opinion (Application No. PCT/JP2016/059808) dated Jun. 21, 2016.
English translation of International Preliminary Report on Patentability (Chapter I) (Application No. PCT/JP2016/059808) dated Oct. 26, 2017, 9 pages.

*Primary Examiner* — Christopher G Young
(74) *Attorney, Agent, or Firm* — Burr & Brown, PLLC

(57) ABSTRACT

A technique enabling a stable resist pattern forming process, when substrate processing apparatuses that perform a resist coating process separately from a developing process. A wafer having been heated after a resist coating process in a first substrate processing apparatus is also heated before an exposure process in a second substrate processing apparatus. Thus, even when amine in an atmosphere adheres to the wafer while it is being transported from the first substrate processing apparatus to the second substrate processing apparatus, the amine scatters by the heating process. At least one of a heating time and a heating temperature is adjusted based on a substrate rest time which includes a period of time between a time point at which a FOUP 10 is unloaded from the first substrate processing apparatus and a time point at which the FOUP 10 is loaded into the second substrate processing apparatus.

10 Claims, 9 Drawing Sheets

SUBSTRATE PROCESSING METHOD, SUBSTRATE PROCESSING SYSTEM AND SUBSTRATE PROCESSING APPARATUS

TECHNICAL FIELD

The present invention relates to a technique for making uniform line widths of a resist pattern formed on a surface of a substrate.

BACKGROUND ART

In a photoresist step that is one of semiconductor manufacturing steps, a coating process in which a surface of a semiconductor wafer (referred to as "wafer" herebelow) is coated with various coating liquids such as a resist and so on, an exposure process in which a coating film is exposed, and a developing process in which the coating film is developed are performed so that a resist pattern is formed.

In a substrate processing system in which the coating process and the developing process are performed, a processing liquid such as a resist liquid used in a coating module for applying a coating liquid is likely to solidify and adhere. When such a processing liquid adheres to the coating module, it is difficult to be removed. Thus, as compared with an exposure apparatus and a developing module, it takes longer time to maintain the coating module, which limits a throughput. Thus, it is known that a preceding stage apparatus including a coating module and a subsequent stage apparatus including a developing module to be connected to an exposure apparatus are separated from each other, in order that an exposure process and a developing process can be performed while the coating module is being maintained. (Patent Document 1).

In such a substrate processing system, in order to save a waiting time of the exposure apparatus (for full-capacity operation), it is required that substrates coated with a resist are loaded into the subsequent stage apparatus without any interruption. In addition, since the preceding stage apparatus including a coating module and the subsequent stage apparatus including a developing module are separated from each other, wafers have to be transported by a carrier between these apparatuses in a factory. In consideration of a problem issuing therefrom, a stable resist pattern forming process should be achieved.

Patent Document 1: JP2007-335626A

DISCLOSURE OF THE INVENTION

The present invention has been made in view of the above circumstances. The object of the present invention is to provide a technique enabling a stable resist pattern forming process, when a substrate processing apparatus that performs a resist coating process and a substrate processing apparatus that performs a developing process are separated from each other.

A substrate processing method according to the present invention comprises the steps of:
applying a resist to a substrate in a first substrate processing apparatus; then heating the substrate in the first substrate processing apparatus;

thereafter bringing the substrate into a carrier and transporting the carrier from a carrier block of the first substrate processing apparatus to a carrier block of a second substrate processing apparatus;

heating the substrate in the second substrate processing apparatus with at least one of a heating time and a heating temperature being adjusted, based on a substrate rest time which includes a period of time between a time point at which the carrier is unloaded from the carrier block of the first substrate processing apparatus and a time point at which the carrier is loaded into the carrier block of the second substrate processing apparatus; and exposing the substrate, and further heating the substrate and then developing the substrate in the second substrate processing apparatus.

The substrate processing system according to the present invention comprises:

a first substrate processing apparatus including a carrier block into which a carrier containing and transporting a substrate is loaded and from which the carrier is unloaded, a resist coating unit in which a resist film is applied onto a substrate taken out from the carrier loaded into the carrier block, and a first heating unit configured to heat the substrate onto which the resist is applied;

a second substrate processing apparatus including a carrier block into which the carrier unloaded from the first substrate processing apparatus is loaded, a second heating unit configured to heat the substrate taken out from the carrier loaded into the carrier block, a third heating unit configured to heat the substrate having been heated in the second heating unit and then exposed, and a developing unit configured to develop the substrate heated in the third heating unit, the second substrate processing apparatus being connected to an exposure apparatus; and a heating adjusting unit configured to adjust at least one of a heating time and a heating temperature of the second heating unit, based on a substrate rest time which includes a period of time between a time point at which the carrier is unloaded from the carrier block of the first substrate processing apparatus and a time point at which the carrier is loaded into the carrier block of the second substrate processing apparatus.

In addition, the substrate processing apparatus of another invention is the first substrate processing apparatus for use in the substrate processing system. Further, the substrate processing apparatus of yet another invention is the second substrate processing apparatus for use in the substrate processing system.

A substrate processing apparatus that applies a resist (first substrate processing apparatus) and a substrate processing apparatus that develops a substrate (second substrate processing apparatus) are separated from each other. A substrate having been heated after a resist coating process in the first substrate processing apparatus is also heated before an exposure process in the second substrate processing apparatus. Thus, even when amine in an atmosphere adheres to the processed substrate while the substrate is being transported by a carrier from the first substrate processing apparatus to the second substrate processing apparatus, the substrate is exposed and developed under the condition that the amine scattered by the heating process. Thus, a resist pattern forming process can be made stable. Namely, line widths and hole diameters of the pattern can be made uniform among the substrates. In addition, by adjusting at least one of a heating time and a heating temperature based on a substrate rest time which includes a period of time between a time point at which the carrier is unloaded from the first substrate processing apparatus and a time point at which the carrier is loaded into the second substrate processing apparatus, variation in amount of the solvent remaining in a resist can be restrained among the substrates, whereby a resist pattern forming process can be made stable.

DESCRIPTION OF THE PREFERRED EMBODIMENTS

Figure 1:
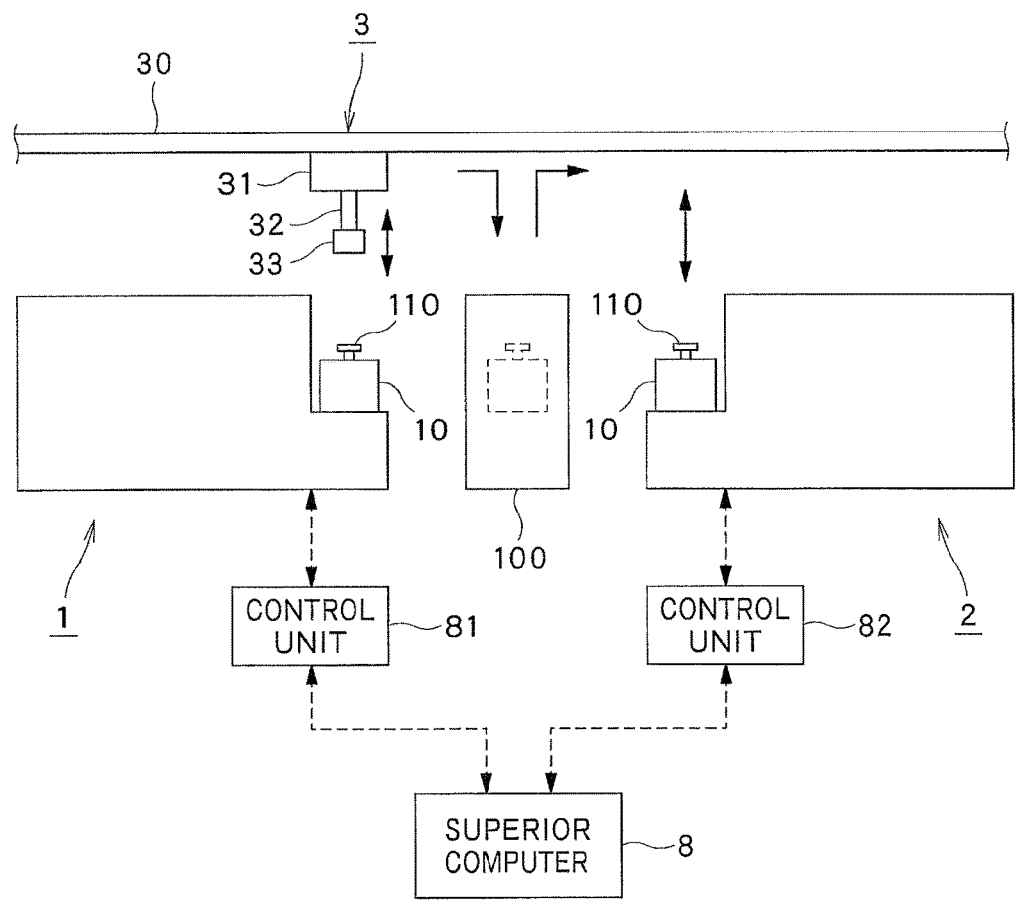
FIG. 1 is a side view of a substrate processing system according to an embodiment of the present invention.

As shown in FIG. 1, a substrate processing system according to an embodiment of the present invention includes a first substrate processing apparatus 1 which applies a coating liquid such as a resist liquid to a semiconductor wafer (referred to as "wafer" below) W that is a substrate, and a second substrate processing apparatus 2 which is connected to an exposure apparatus and develops an exposed wafer W.

In addition, the substrate processing system is provided with a carrier transport mechanism 3 such as an OHT (Overhead Hoist Transport) for transporting a FOUP 10, which is a carrier (transport container) containing wafers W having been processed in the first substrate processing apparatus 1 to the second substrate processing apparatus 2. The carrier transport mechanism 3 utilizes a part of an in-factory transport mechanism for transporting the FOUP 10 throughout the factory, and includes a function for transporting the FOUP 10 unloaded from the second substrate apparatus 2 to a next substrate processing apparatus. To be specific, the carrier transport mechanism 3 is composed of a rail 30 provided on a ceiling part of the factory, and a body part 31 formed of a robot configured to be movable along the rail 30. The body part 31 has a grip part 33 for gripping the FOUP 10 on a lower part thereof through an elevation belt 32. The grip part 33 grips a head part 110 disposed on the FOUP 10 and transports the FOUP 10 in a suspended manner. The grip part 33 is vertically moved so as to deliver the FOUP 10 to the respective apparatuses.

In addition, a carrier waiting unit 100 on which a plurality of FOUPs 10 are temporarily placed, for example, is provided along a transport path of the carrier transport mechanism 3. Thus, a FOUP 10, which has been unloaded from the first substrate processing apparatus 1, is once placed on the carrier waiting unit 10, before the FOUP 10 is loaded into the second substrate processing apparatus 2, for example.

Figure 2:
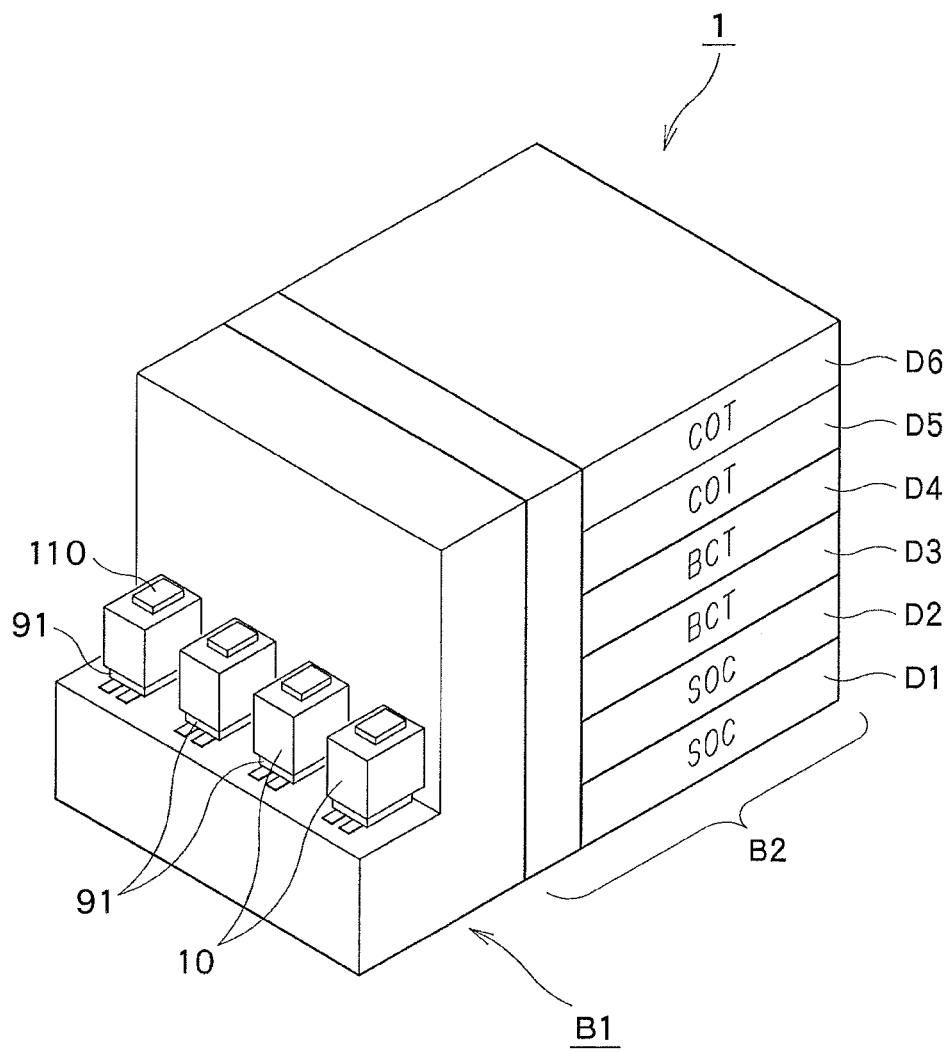
FIG. 2 is a perspective outline view showing a first substrate processing apparatus according to the embodiment of the present invention.
Figure 3:
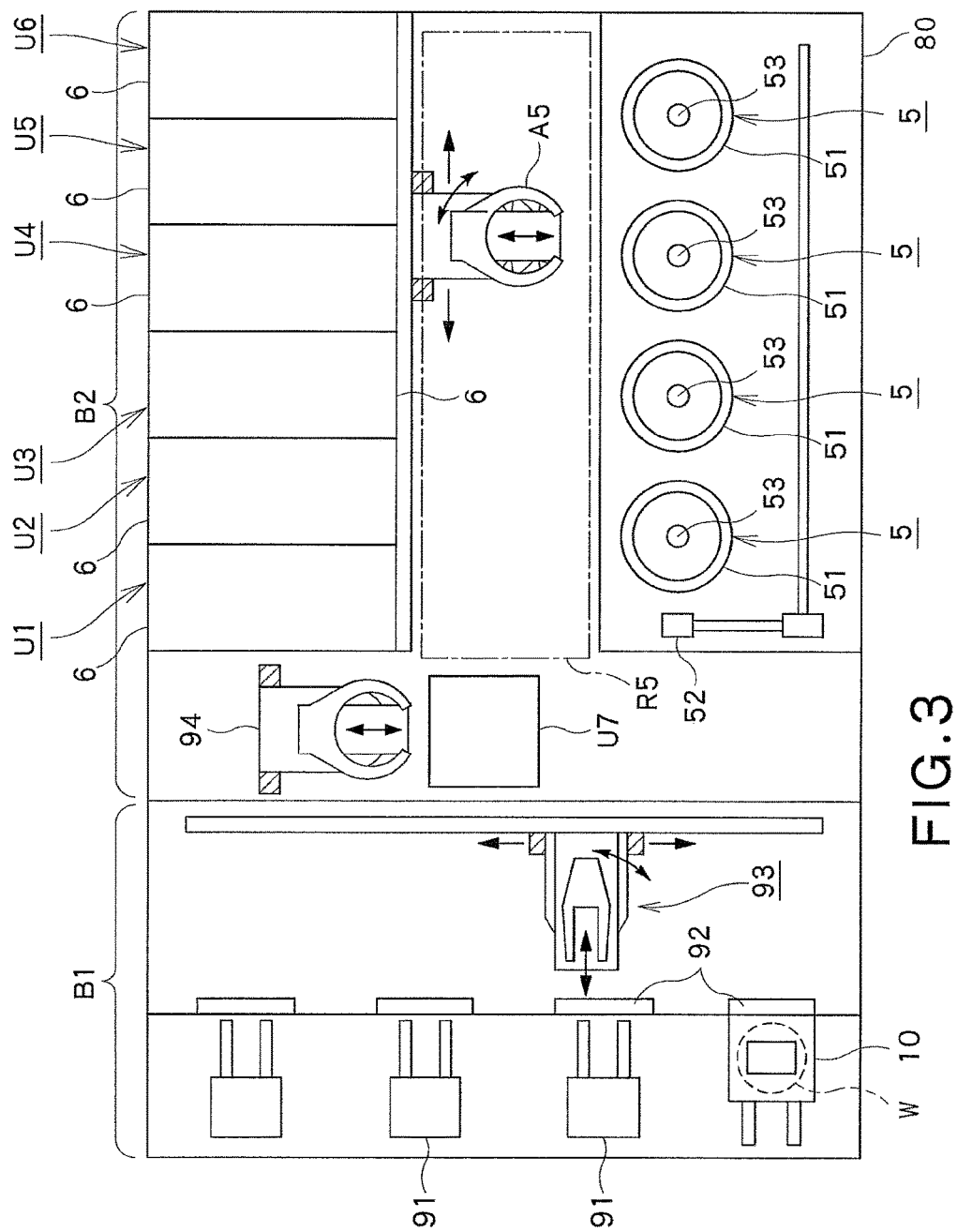
FIG. 3 is a plan view showing the first substrate processing apparatus according to the embodiment of the present invention.

The first substrate processing apparatus 2 is described. As shown in FIGS. 2 and 3, the first substrate processing apparatus 1 is constituted by connecting a carrier block B1 through which a wafer W is loaded from the FOUP 10 into the apparatus or unloaded from the apparatus into the FOUP 10, and a processing block B2 in which a coating film is formed on a surface of a wafer W. The carrier block B1 includes a placement stage 91 on which a FOUP 10 is placed, a door 92, and a transport arm 93 for transporting a wafer W from a FOUP 10 through the door 92. The door 92 is disposed on a partition wall partitioning an inner atmosphere of the first substrate processing apparatus 1 and an outer atmosphere thereof, and is opened or closed together with a lid of the FOUP 10 placed on the placement stage 91.

The processing block B2 is constituted by stacking first to sixth unit blocks D1 to D6 in this order from below. The unit blocks D1 to D6 are configured to liquid-process a wafer W. In FIG. 2, the alphabet characters on the respective unit blocks D1 to D6 specify process kinds. SOC signifies an SOC (Spin On Cap) film forming process, BCT signifies an antireflection film forming process, and COT signifies a resist film forming process in which a resist is supplied to a wafer W so as to form thereon a resist film.

FIG. 3 shows a structure of the unit block D5 as a representative. The unit block D5 includes a main arm A5 that moves along a linear transport area R5 extending from the side of the carrier block 131 to a rear side, a liquid processing unit 80 as a liquid processing unit, which has a resist coating unit 5 that applies a resist liquid to a wafer W, and shelf units U1 to U6 formed by stacking heating units 6 for subjecting a wafer W to a first heating process (first PAB: pre-exposure heating process) before an exposure process.

In the transport area R5 on the side of the carrier block B1, a shelf unit U7 constituted by stacking a plurality of stages is disposed. Delivery of a wafer W between the transport arm 93 and the main arm A5 is performed through a delivery module of the shelf unit U7 and the transport arm 94. The respective unit blocks D1, D3 and D5 have substantially the same structure, excluding that a coating film to be formed on a wafer W differs. The unit blocks D1 and D2 apply an SOC film, and the unit blocks D3 and D4 apply an antireflection film.

An FFU (Fan Filter Unit) is disposed on a ceiling part of the first substrate processing apparatus 1. The FFU is provided for generating a downward flow of clean air in the first substrate processing apparatus 1, so as to keep clean an atmosphere inside the first substrate processing apparatus 1. A clean gas may be a clean air or inert gas such as nitrogen gas that has passed through a ULPA (Ultra Low Penetration Air) filter or an HEPA (High Efficiency Particulate Air) filter.

A structure of the liquid processing unit is described referring to the resist coating unit 5. The resist coating unit 5 applies, to a wafer W, a resist such as a chemically amplified resist. As shown in FIG. 3, the resist coating unit 5 includes a cup module 51 and a nozzle unit 52. The cup module 51 has a spin chuck configured to be rotatable about a vertical axis, while sucking a central portion of a rear surface of a wafer W so as to horizontally hold the same. A cup body (cup assembly in detail) having an upper opening is disposed around the spin chuck 53 so as to surround a wafer W on the spin chuck 53. The cup body is configured to receive a solvent that is spun off from a wafer W and to discharge the solvent, as well as to discharge air from a lower exhaust path so that mist is not scattered in the processing atmosphere. The cup body rotates the wafer W while supplying a resist liquid thereto, so that the surface of the wafer W is coated with the resist liquid.

Figure 4:
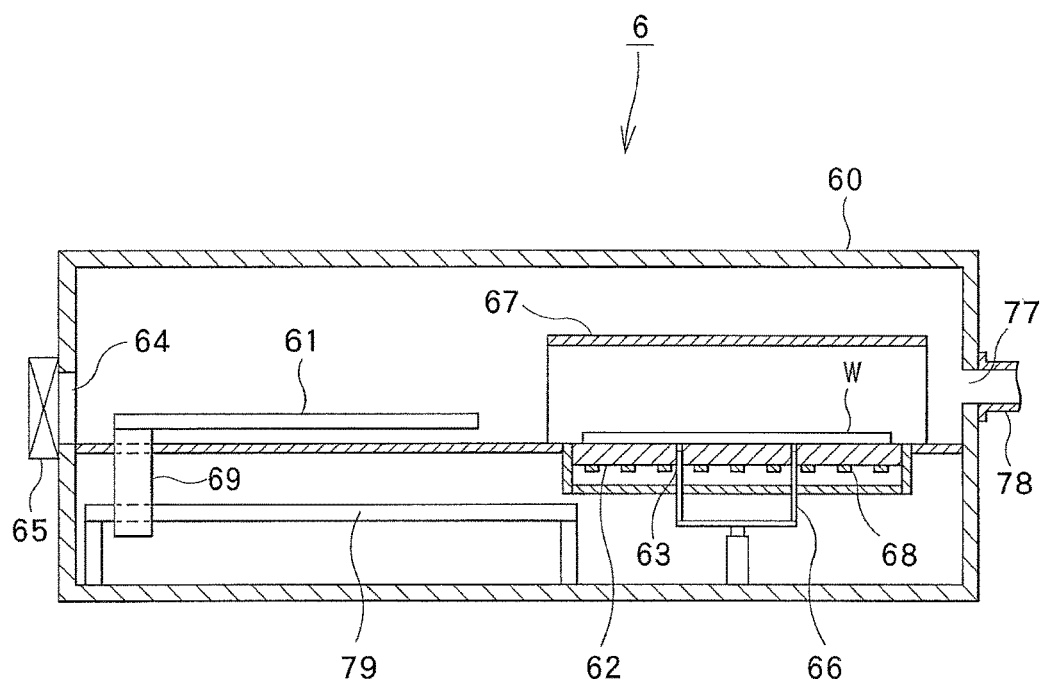
FIG. 4 is a sectional view showing a heating unit.

Next, the first heating unit 6 is described. As shown in FIG. 4, the first heating unit 6 is formed by longitudinally arranging side by side a hot plate 62 and a transport arm 61 in a housing 60. The transport arm 61 also serves as a cooling part of a wafer W. A longitudinal side surface of the housing 60 on the side of the transport arm 61 is equipped with a loading/unloading port 64. A shutter 65 for opening or closing the loading/unloading port 64 is disposed on the loading/unloading port 64.

A heater 68 is provided on a lower surface of the hot plate 62, so that a wafer W placed on the hot plate 62 is heated. Three through-holes 63 are circumferentially formed in a surface of the hot plate 62. Elevation pins 66 for delivering a wafer W to and from the transport arm 61 are configured to project from or recessed into the respective through-holes 63. In addition, there is a cover part 67 covering an upper part of a wafer W placed in the heating unit 6 so as to efficiently heat the wafer W. The transport arm 61 is configured to be displaceable by a moving mechanism 69 along a guide rail 79 with respect to the hot plate 62. An exhaust unit 77 is disposed on a side surface of the housing 60. The exhaust unit 77 is connected to an exhaust pump, not shown, through an exhaust pipe 78.

Figure 5:
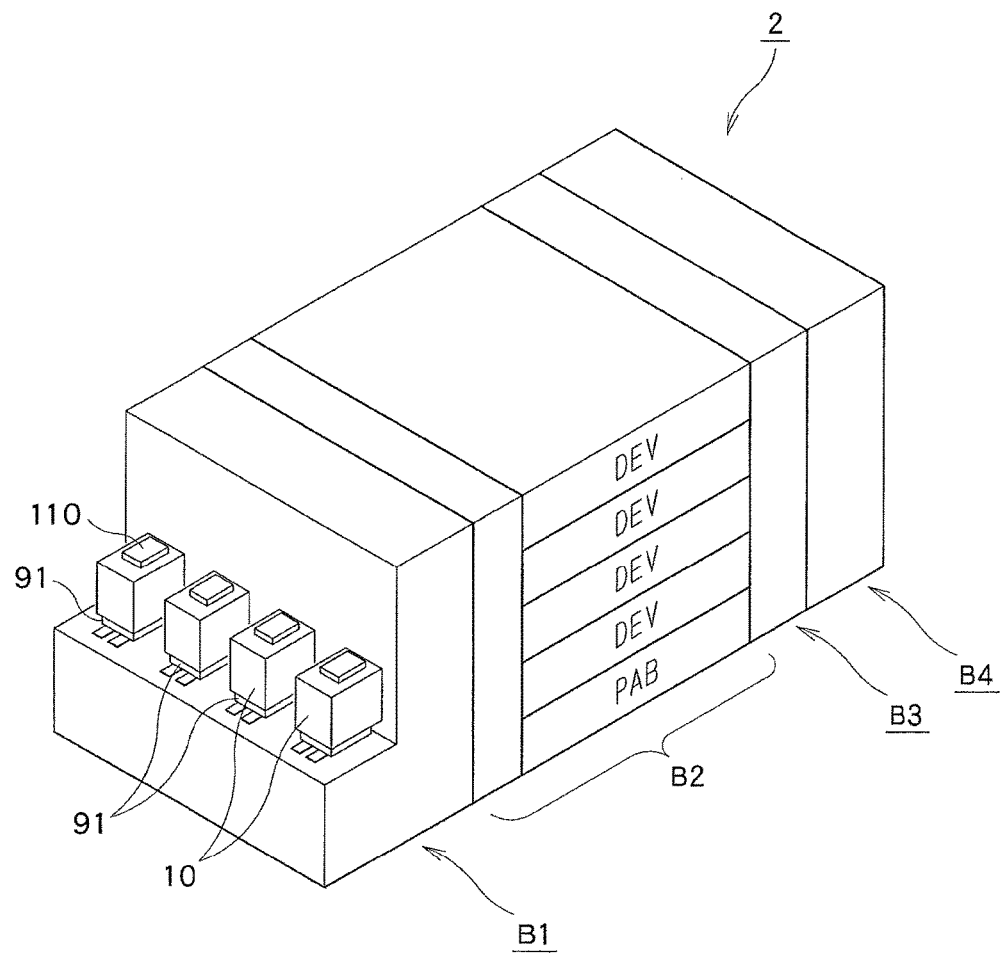
FIG. 5 is a perspective outline view showing a second substrate processing apparatus according to the embodiment of the present invention.

Next, the second substrate processing apparatus 2 is described. As shown in FIG. 5 the second substrate processing apparatus 2 is constituted by connecting a carrier block B1, a processing block B2, and an interface block B3 to one another. The carrier block B1 and the processing block B2 have the similar structures those of the first substrate processing apparatus 1. An exposure apparatus B4 is connected to the rear side of the interface block B3. In the processing block B2 of the second substrate processing apparatus 2, four unit blocks are stacked. Namely, on a lower side, there is a unit block (shown by "PAB" for the sake of convenience in FIG. 5) for subjecting a wafer W to a second heating process (second PAB) before an exposure process. In addition, unit blocks (shown by "DEV" for the sake of convenience in FIG. 5) for performing a developing process are stacked thereabove.

The unit block PAB for performing the second heating process before an exposure process is not provided with a liquid processing module, but is provided with, as a heating unit, a second heating unit having the same structure as that of the first heating unit 6, for example. The unit block DEV for performing a developing process is provided with, as a liquid processing unit, a developing unit that supplies a developer so as to perform a developing process, and is provided with, as a heating unit, a third heating unit having substantially the same structure as that of the first heating unit 6, for performing a post-exposure heating process (PEB), with a linear transport path of the transport arm being interposed between the developing unit and the third heating unit.

The interface block B3 is a block through which a wafer W is delivered between the processing block B2 and the exposure apparatus B4. The interface block B3 includes a delivery stage group for delivering a wafer W between the interface block B3 and the processing block B2, a delivery stage group for delivering a wafer W between the interface block B3 and the exposure apparatus B4, a transport mechanism that delivers a wafer W between these delivery stage groups, and so on.

Similarly to the first substrate processing apparatus 1, an FFU is disposed on a ceiling part of the second substrate processing apparatus 2, so that an atmosphere inside the second substrate processing apparatus 2 is kept clean.

Returning to FIG. 1, the first substrate processing apparatus 1 is equipped with a first apparatus control unit 81 for controlling the substrate processing apparatus 1, and the second substrate processing apparatus 2 is equipped with a second apparatus control unit 82 for controlling the second substrate processing apparatus 2. Although the first/second apparatus control unit 81 (82) can be regarded as a part of the first substrate processing apparatus 1 (second substrate processing apparatus 2), the first/second apparatus control unit 81 (82) is considered as a unit that controls the first substrate processing apparatus 1 (the second processing apparatus 2), for the sake of convenience.

The first apparatus control unit 81 includes a detection unit which has a function for controlling the processing units (modules) and the transport arms 83, 94 and A5 of the resist coating unit 5 and so on of the first substrate processing apparatus 1 based on process recipes and transport recipes, and is configured to detect a timing at which a FOUP 10 containing processed wafers W is unloaded. As an example of a method of detecting an unloading timing of the FOUP 10, there may be a method that regards a timing at which the door 92 of the carrier block B1 is closed after processed wafers W have been returned to the FOUP 10, as an unloading timing of the FOUP 10. Since the returned FOUP 10 is promptly transported to the carrier waiting unit 100 by the carrier transport mechanism 3, the timing corresponds to the unloading timing.

In addition, the first apparatus control unit 81 recognizes on a real-time basis a location of a wafer W in the substrate processing apparatus 1. The first apparatus control unit 81 also recognizes the order of the wafer W, and recognizes in which lot the wafer W is contained. Thus, since the first apparatus control unit 81 recognizes which lot the FOUP 10 contains when processed wafers W are returned to the FOUP 10 and the door 92 is closed, the first apparatus control unit 81 can store in a memory the lot (identification code of lot or FOUP 10) and a timing at which the FOUP 10 is unloaded from the first substrate processing apparatus 1 in such a manner that the lot and the timing are correlated to each other.

The first apparatus control unit 81 and the second apparatus control unit 82 are connected to a superior computer 8. The superior computer 8 has a function of transmitting an identification code of a lot (group of wafers W in one FOUP 10) now to be loaded and a process recipe of the lot, to the first apparatus control unit 81 and the second apparatus control unit 82. Further, the superior computer 8 has a function of receiving a clock time at which a FOUP 10 is unloaded from the first apparatus control unit 81, and transmitting the clock time to the second apparatus control unit 82 in such a manner that the clock time is correlated to the FOUP 10.

The second apparatus control unit 82 has a function of controlling the processing units such as the second heating unit 50, the third heating unit and the developing unit of the second substrate processing apparatus 2 and the transport arms based on process recipes and transport recipes. In addition, the second apparatus control unit 82 includes a detection unit configured to detect a timing (clock time) at which a FOUP 10 containing wafers W is loaded thereinto. Similarly to the case of the first substrate processing apparatus 1, for example, the detection unit detects a clock time at which the door of the carrier block B1 is opened together with the lid of the FOUP 10.

Figure 6:
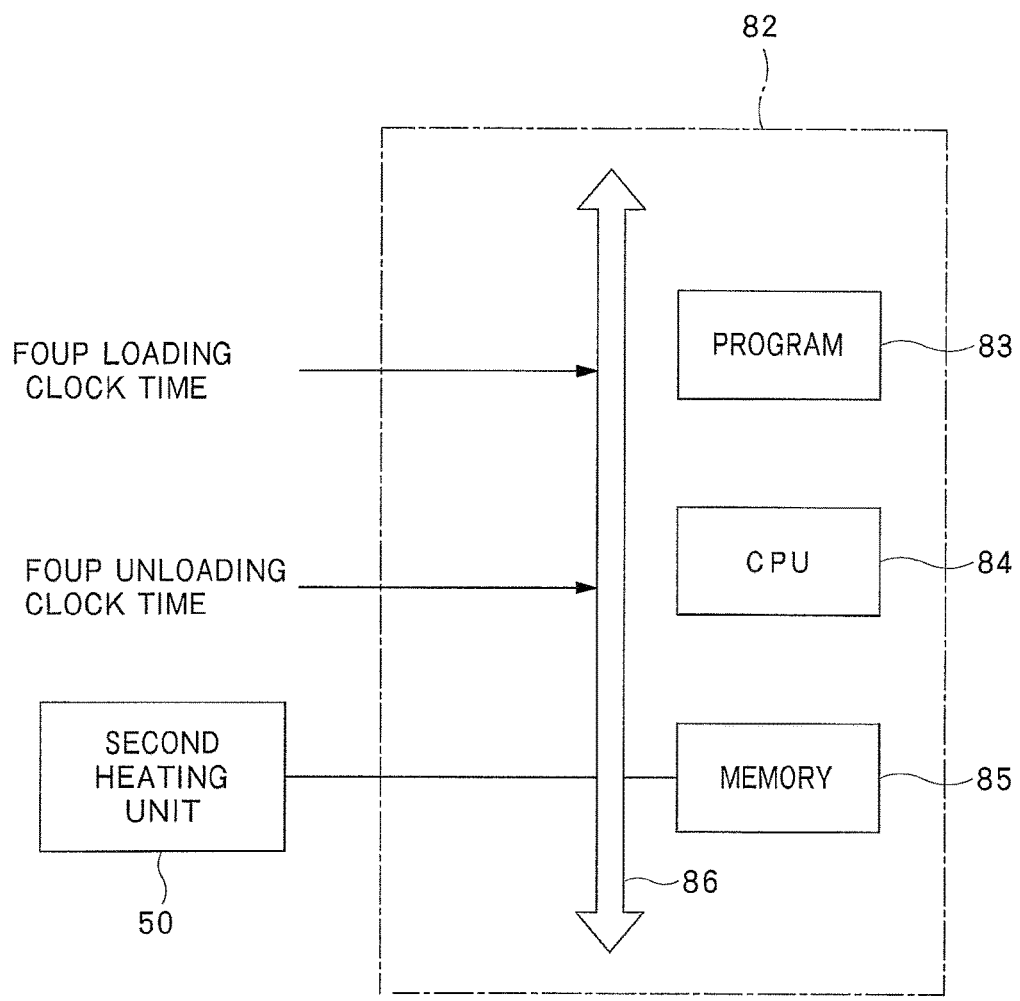
FIG. 6 is an explanatory view showing a control unit of the second substrate processing apparatus of the present invention.

FIG. 6 is a block diagram showing the second apparatus control unit 82. A program storing unit storing a program 83, a CPU 84 and a memory 85 are connected to a bus 86. The program 83 includes a software such as recipes of a series of processes performed in the second substrate processing apparatus 2 and recipes of transporting a wafer W. In addition, in the second substrate processing apparatus 2 in this example, the program 83 has a step group by which a signal at which the door 92 is opened together with the lid of the FOUP 10 is received, and a clock time thereof is written in the memory 85 in such a manner that the clock time is correlated to a lot of the loaded FOUP 10. Thus, the program 83 constitutes a detection unit that detects a clock time at which a FOUP 10 is loaded.

Further, the program 83 includes a step group by which an unloading clock time (a clock time at which the FOUP 10 is unloaded from the first substrate processing apparatus) transmitted from the superior computer 8 is referred to, and a rest time of the FOUP 10 is calculated. In addition, the memory 85 stores data in which a rest time of the FOUP 10 and a heating time of the second heating unit 50, for example, are correlated to each other. The program 83 further has a step group by which a heating time of the second heating unit 50 is calculated based on the calculated rest time and the data in the memory 85. In this example, the first apparatus control unit 81, the superior computer 8 and the second apparatus control unit 82 share a measurement unit that measures a rest time.

The significance of adjusting a heating time of the second heating unit 50 is as follows. Since a solvent of the resist used in this example cannot be completely vaporized in a realistic rest time considering a throughput, the resist still includes the solvent an amount of which corresponds to a rest time length, at a time point immediately before a heating process in the second heating unit 50. When the solvent reduces, the reduction prevents generation of acid in the resist upon an exposure process and diffusion of the acid in the resist in the heating process (PEB) before a developing process, so that a line width of a pattern varies depending on an remaining amount of the solvent. Thus, in order to make uniform line widths among wafers W, it is necessary to make uniform remaining amounts of the solvent in the resist before an exposure process.

A remaining amount, in other words, a vaporization amount of the solvent in the resist depends on a rest time that is between a time point at which a wafer W is subjected to a heating process in the first heating unit 6 of the first substrate processing apparatus 1, and a time point at which the wafer W is loaded into the substrate processing apparatus 2 and a heating process is started in the second heating unit 50. Thus, in order to previously determine uniform amounts of the solvent in the resist before an exposure process among the respective lots prior to the exposure process, the second heating unit 5 is provided, and energy for heating is adjusted in the second heating unit 50 in accordance with a rest time.

In the first substrate processing apparatus 1, a wafer W is promptly returned to the FOUP 10 after a heating process (first PAB) of the first heating unit 6. In addition, after the FOUP 10 is loaded into the second substrate processing apparatus 2, a heating process (second PAB) is promptly performed in the second heating unit. Thus, a rest time varies depending on a period of time in which the FOUP 10 is transported from the first substrate processing apparatus 1 to the second substrate processing apparatus 2. Thus, as described above, the rest time of the FOUP 10 is managed.

In the aforementioned example, a clock time at which the FOUP 10 is unloaded from the first substrate processing apparatus (in detail, a clock time at which the door 92 is closed) is employed as a measurement start time of the rest time of the FOUP 10. However, the measurement start time may be a clock time at which a heating process (first PEB) is finished in the first heating unit 6, e.g., a clock time at which a wafer W of a final number of a lot is unloaded from the first heating unit 6, or a clock time at which a wafer W having been subjected to the first PAB is delivered to the transport arm 93 in the carrier block B1.

The reason for measuring a rest time resides not in grasping a rest time itself but in grasping a difference in rest time among the respective lots. Thus, the measurement start time may be a clock time at which the FOUP 10 is unloaded from the carrier waiting unit 100. A waiting time of the FOUP 10 in the carrier waiting unit 100 has a great impact on a rest time, a difference in rest time among the respective lots is reflected also in this case. Thus, the fact that a heating time of the second PAB is adjusted based on the rest time can be equivalent to a case in which a rest time, which is between a time point at which the FOUP 10 is unloaded from the substrate processing apparatus 1 and a time point at which the FOUP 10 is loaded into the second substrate processing apparatus 2, is measured.

Figure 7:
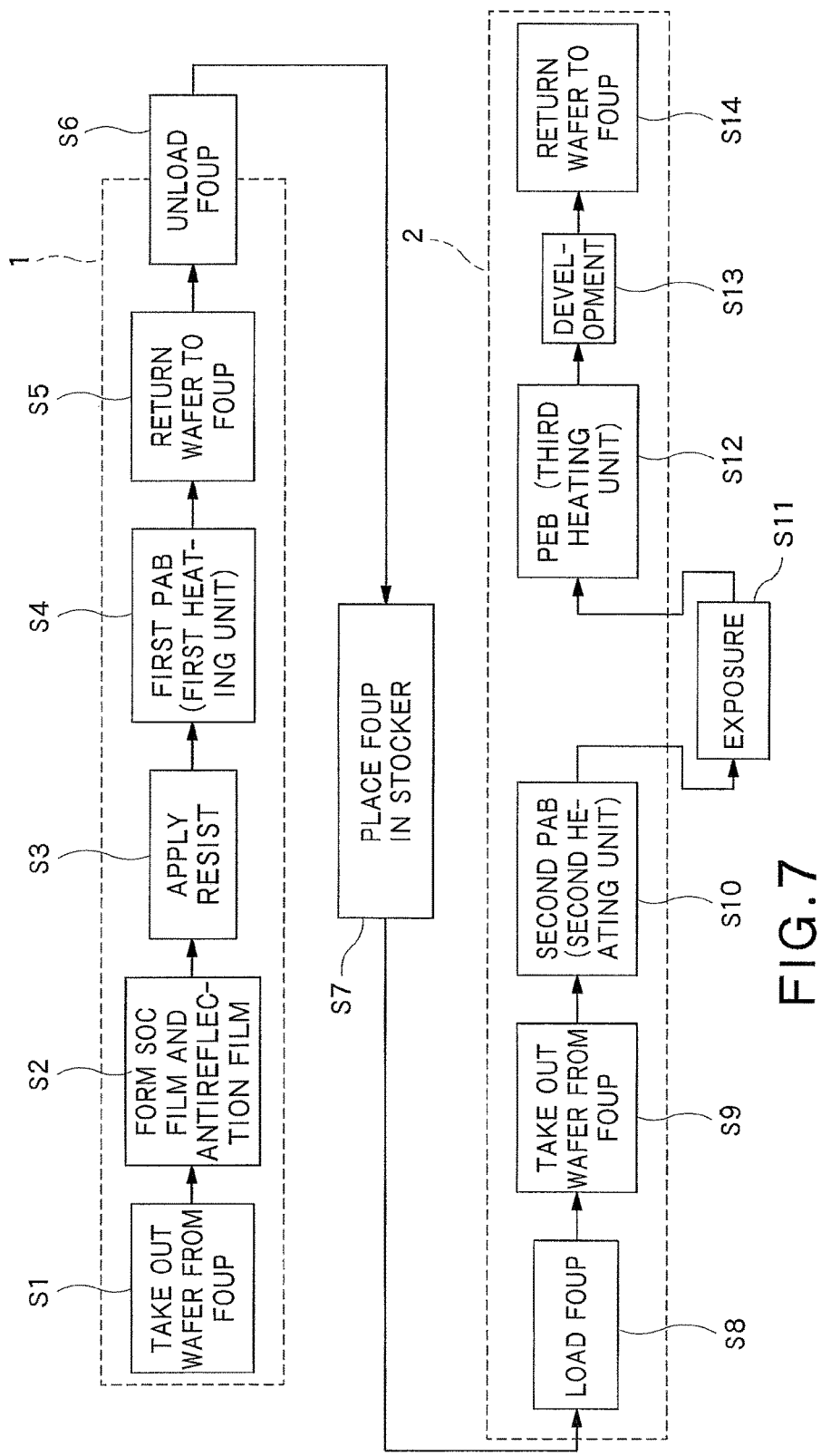
FIG. 7 is a flowchart showing wafer processing steps in a substrate processing system.

Next, an operation of the above-described embodiment is described with reference to the flowchart of FIG. 7. Firstly, a FOUP 10 containing twenty five wafers W each having a diameter of 300 mm is transported by the carrier transport mechanism 3 to be placed on the placement stage 91 of the carrier block B1 of the first substrate processing apparatus 1. Then, the wafers W are taken out from the FOUP 10 by the transport arm 93, and are placed on the shelf unit U7 (step S1). Thereafter, an SOC film as a ground film serving as an etching mask with a resist is formed on each wafer W in the first unit block D1, for example, and then the wafer W is transported to the third unit block D3 and an antireflection film is formed thereon (step S2). Thereafter, the wafer W is loaded into the unit block D5, for example, and a resist liquid is applied thereto (step S3).

Then, the wafer W coated with a resist film is delivered by the main arm A5 to the transport arm 61 of the first heating unit 6. Thereafter, the wafer W is placed on the hot plate 62 by the transport arm 61, and is heated at 80 to 100° C. for 60 seconds (the first PAB is performed (step S4)), for example. Thus, a solvent included in the resist film is vaporized. Thereafter, the wafer W is delivered from the hot plate 62 to the transport arm 61, and is then delivered to the main arm A5. After that, the wafer W is delivered to the shelf unit U7 and is then returned to the FOUP 10 by the transport arm 93, and the door 92 is closed together with the lid of the FOUP 10 (step S5).

Following thereto, the FOUP 10 is suspended by the OHT, for example, from the carrier block B1 of the first substrate processing apparatus 1 (step S6). As described above, when the lid of the FOUP 10 is closed (when the door 92 is closed), the first apparatus control unit 81 can recognize this clock time. Thus, the clock time is transmitted as an unloading clock time of the FOUP 10 to the superior computer 8. For the sake of the convenience, the following description is made referring to this clock time as t1. Then, the FOUP 10 unloaded from the first substrate processing apparatus 1 is transported to the carrier waiting unit 100 to wait here (step S7).

When a ratio between the number of the first substrate processing apparatus 1 and the number of the second substrate processing apparatus 2 is 1:1, the number of substrates to be processed (throughput) per unit time in the first substrate processing apparatus 1 as a whole is set greater than the number of substrates to be processed per unit time in the exposure apparatus B4, for example. Thus, the carrier waiting unit 100 serves as a buffer area where the FOUP 10 is always waiting, so that the exposure apparatus B4 is operated at full capacity. Alternatively, when a plurality of the first substrate processing apparatuses 1 are used relative to one second substrate processing apparatus 2, a throughput of the plurality of first substrate processing apparatuses 1 as a whole is set greater than a throughput of the exposure apparatus B4.

Thereafter, the FOUP 10 placed on the carrier waiting unit 100 is suspended by the carrier transport mechanism 3, and is placed on the placement stage 91 of the carrier block B1 in the second substrate processing apparatus 2 (step S8). Then, the door 92 of the second substrate processing apparatus 2 is opened together with the lid of the FOUP 10, and the wafers W are taken out from the FOUP 10 (step S9).

As described above, the unloading clock time t1 at which the FOUP 10, which is now loaded into the second substrate processing apparatus 1, has been unloaded from the first substrate processing apparatus 1 is written in the memory 85 of the second apparatus control unit 82, from the first apparatus control unit 81 through the superior computer 8. Since the second apparatus control unit 82 recognizes a clock time t2 at which the door 92 of the carrier block B1 of the second substrate processing apparatus 2 is opened, the second apparatus control unit 82 calculates a time Δt by subtracting the clock time t1 from the clock time t2, which corresponds to a rest time of the FOUP 10. Further, the second apparatus control unit 82 reads out a heating process time of the second heating unit 50, which corresponds to the rest time Δt, from the data in the memory 85, and sets the time as the heating process time of the second heating unit 50.

Each wafer W taken out from the FOUP 10 is loaded into the second heating unit 50, and is heated on the hot plate for the set heating process time, so as to perform the second PAB (step S10). Namely, when the rest time of the FOUP 10 is long, a vaporization time of the solvent in the resist film of the wafer W in the FOUP 10 is long. Thus, since the amount of the solvent in the resist film is small, the time of the second PAB is set shorter. On the other hand, when the rest time of the FOUP 10 is short, the vaporization time of the solvent in the resist film is short. Thus, since the amount of the solvent in the resist film is large, the time of the second PAB is set longer. Therefore, the amounts of the solvent in the resist film of the wafer W after it is subjected to the second PAB can be made securely uniform among the lots. In other words, variation in amount of the solvent is small.

Following thereto, the wafer W is taken out from the second heating unit 50, and is loaded into the exposure apparatus B4 where an exposure process is performed thereto (step S11). When the wafer W is exposed, acid is generated from a photosensitizing agent included in the resist. Then, the wafer W is unloaded from the exposure apparatus B4 and is loaded through the interface block B3 into the third heating unit where the wafer W is heated at 80 to 100° C. for 60 seconds, for example, so as to perform the PEB. By means of the post-exposure heating process in the third heating unit, the acid in the resist film, which was generated upon the exposure process, is diffused to function as a catalyst, so as to decompose a base resin that is a main component of the resist film, for example (step S12).

The wafer W taken out from the third heating unit is loaded into the developing unit where the wafer W is developed (step S13). In the developing unit, similarly to the aforementioned resist coating unit, a developer is supplied to the wafer W by spin coating. Thus, a part of the resist film where the acid is diffused upon PEB is dissolved, so that a resist pattern is formed. After that, the wafer W is returned to the FOUP 10 (step S14).

The aforementioned embodiment provides the following effects. Although the insides of the first and the second substrate processing apparatuses 1, 2 are in a clean atmosphere by means of the FFUs, amine is necessarily contained in an atmosphere outside the apparatus. Thus, during the process in which a wafer W having a resist film formed thereon is returned to the FOUP 10, unloaded from the first substrate processing apparatus 1 and then loaded into the second substrate processing apparatus 2, the wafer W passes through the atmosphere containing amine (atmospheric air).

Since clean air is supplied into a factory, an amount of amine contained therein is small. However, even a small amount of amine seriously prevents diffusion of acid in the chemically amplified resist, for example. Thus, although the PAB is performed in the first substrate processing apparatus 1 after the resist liquid has been already applied, the second PAB is again performed before the exposure process in the second substrate processing apparatus 2 to which the FOUP 10 is transported, in order to cause amine in the resist film to scatter and disappear. Thus, defective development can be prevented, and variation in line width of the pattern can be restrained.

In addition, the rest time which is between a time point at which the FOUP 10 is unloaded from the first substrate prosing apparatus, and a time point at which the FOUP 10 is loaded into the second substrate processing apparatus 2, is measured. A heating time of the second PAB, which is the heating process performed in the second heating unit 50 of the second substrate processing apparatus 2, is adjusted based on the rest time. Thus, variation in amount of the solvent remaining in the resist film can be restrained among the lots of the wafers W, whereby a resist pattern forming process can be made stable.

In place of adjusting a heating time of the second heating unit 50, a heating temperature can be adjusted based on the aforementioned rest time. As shown by the below verification test, by adjusting a heating temperature of the second heating unit 50, a line width of the resist pattern can be adjusted. Thus, also in this case, the same effect is obtained. In the case of adjusting a heating temperature, data in which a rest time and a heating temperature are correlated to each other are previously stored in the memory 85. Moreover, both a heating time and a heating temperature may be adjusted depending on a rest time. In this case, data in which a rest time, and a heating time and a heating temperature are correlated to each other are stored in the memory 85.

Not limited to the measurement of time, the aforementioned rest time can be obtained by prediction of time. For example, when a time at which a FOUP 10 to be newly placed on the carrier waiting unit is taken out from the carrier waiting unit 100 can be predicted depending on the number of already waiting FOUPs 10, the superior computer 8 may predict a rest time based on the waiting number of FOUPs 10, for example. In this case, the predicted rest time is transmitted from the superior computer 8 to the second apparatus controller 82.

Moreover, when there is used such a resist that an amount of a solvent in a resist film is stabilized for a short period of time e.g., about a general rest time when a factory is operated, it is not necessary to adjust energy for heating of the second PAB depending on a rest time.

Figure 8:
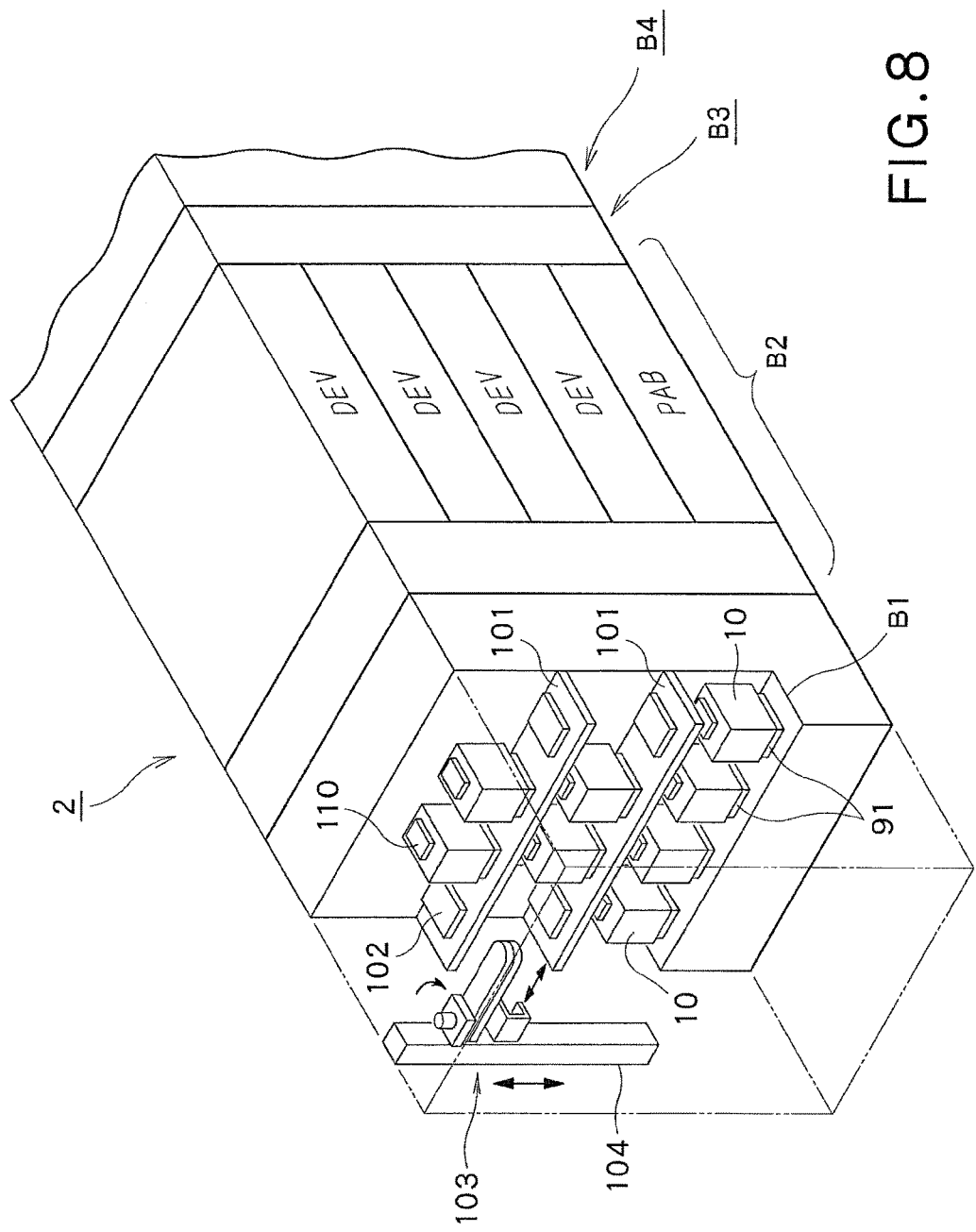
FIG. 8 is a perspective view showing a carrier waiting unit according to another example of the embodiment of the present invention.

Further, the second substrate processing apparatus 2 may be provided with a carrier waiting unit. FIG. 8 shows a structural example in this case. A plurality of, e.g., two shelf units 101 are disposed above the placement stage 91 in the carrier block B1 of the second substrate processing apparatus 2. A placement stage 102 on which a carrier is placed is provided on each shelf unit 101. In this example, the row of the lowermost stages 91 corresponds to the carrier block B1, and the stages 102 on the upper and lower shelf units 101 correspond to the carrier waiting unit 100. Further, there is provided a carrier delivery mechanism 103 for moving a FOUP 10 among the respective placement stages 91 and 102. The carrier delivery mechanism 103 includes a not-shown horizontal guide which extends along the row of the stages 102 and vertically moves along an elevation guide 104, and an articulation arm 105 which is configured to be movable along the horizontal guide and to hold the head part 110 of the FOUP 10. In such a structure, a FOUP 10 unloaded from the carrier block B1 in the first substrate processing apparatus 1 is delivered by the carrier transport mechanism 3 to a predetermined placement stage 102 for loading/unloading of the upper shelf unit 101, and then the FOUP 10 is delivered to another placement stage 102 by the carrier delivery mechanism 103 and is made to wait there. After that, the FOUP 10 waits its turn, and the FOUP 10 is delivered by the carrier delivery mechanism 103 to the placement stage 91 of the lowermost shelf corresponding to the carrier block B1. Then, wafers W in the FOUP 10 are taken out.

Further, in the above-described embodiment, although there is described the substrate processing method in which acid is generated in an exposed area of a resist film so that the resist film is dissolved, the method may be a substrate processing method in which an exposed area of the resist film becomes not-dissolvable by acid.

Furthermore, the second PAB and the PEB may be performed in the second heating unit 50.

(Verification Test)

A relationship between the aforementioned rest time and a CD (Critical Dimension) of a rest pattern at a set temperature of the second heating unit 50 were examined as follows. With the use of the substrate processing system according to the above embodiment, a heating time of the second heating unit was set as 60 seconds. A heating temperatures of the second heating unit was set as 80° C., 77.5° C. and 75° C. Under the respective temperature conditions, a rest time (time in which a FOUP 10 was left outside the first substrate processing apparatus 1) was set as 3 hours, 6 hours and 12 hours. After the heating process to each wafer W by the second heating unit 50 had been finished, the wafer W was exposed, and a line width of a pattern was measured. In addition, an example in which a resist film was formed and a FOUP 10 containing wafers W was unloaded from the first substrate processing apparatus and immediately loaded into the second substrate apparatus 2 is shown as an example in which a rest time is 0, for the sake of convenience.

Figure 9:
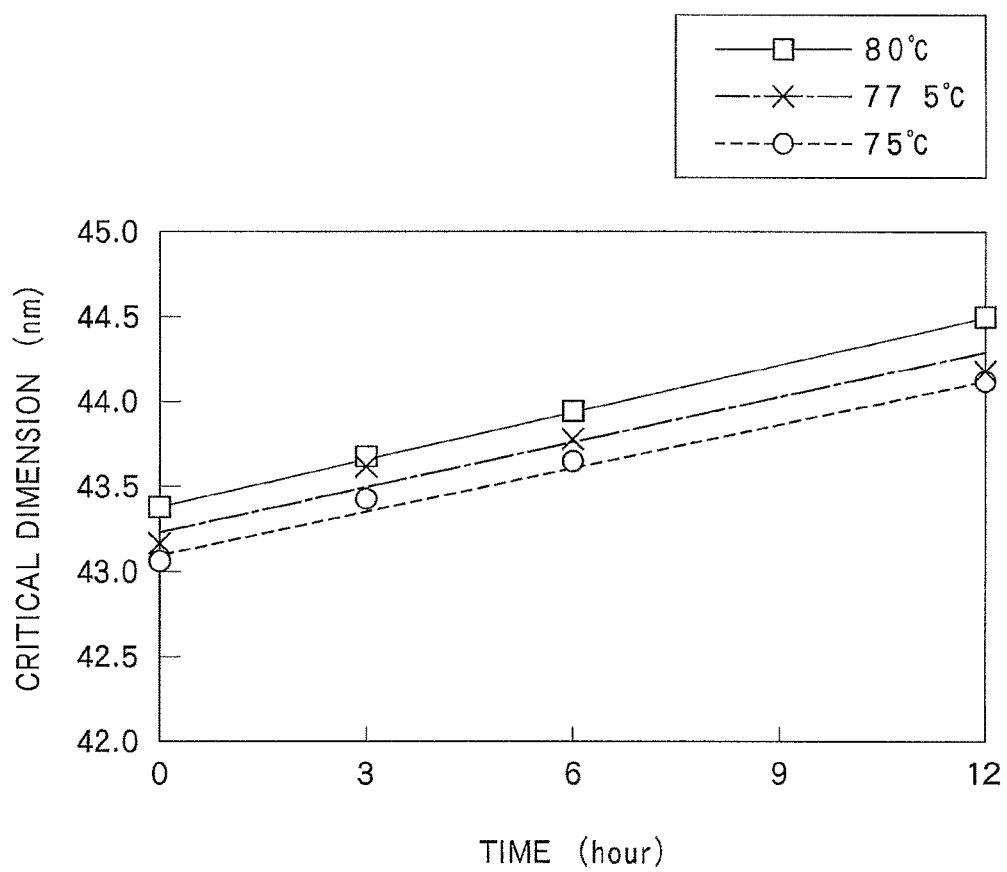
FIG. 9 is a characteristic diagram showing a relationship between a wafer rest time and a line width of a formed pattern.

FIG. 9 shows the result, showing a relationship between the rest time and the CD of the resist pattern when the heating temperature of the second heating unit 50 was set at 80° C., 77.5° C. and 75° C., respectively.

According to this result, it can be understood that the longer the rest time becomes, the thicker the CD becomes. From the graph of FIG. 9, it can be understood that, after the resist used in the above example was applied onto a wafer W and heated (after the first PAB was performed), even a time as long as 6 hours passed, the CD became larger by the further elapse of time thereafter. It can be sufficiently predicted that an amount of the solvent cannot have a constant value even after 12 hours. Thus, it can be understood that, in this resist, an amount of the solvent varies depending on the rest time after the first PAB, and can be understood that it is effective that the second PAB is performed in the second substrate processing apparatus 2 by means of energy for heating depending on the rest time.

In addition, it can be understood that the CD becomes smaller by lowering the heating temperature of the second heating unit 50. It is estimated that the solvent included in the resist film is evaporated by increasing the heating temperature, so that the diffusion length of acid upon PEB becomes shorter whereby the CD increases.

1 First substrate processing apparatus
2 Second substrate processing apparatus
3 Carrier transport mechanism
5 Resist coating unit
6 First heating unit
8 Superior computer
81 First apparatus control unit
82 Second apparatus control unit
10 FOUP
100 Carrier waiting unit
W Wafer

The invention claimed is:

1. A substrate processing method comprising the steps of:
    applying a resist to a substrate in a first substrate processing apparatus;
    then heating the substrate in the first substrate processing apparatus;
    thereafter bringing the substrate into a carrier and transporting the carrier from a carrier block of the first substrate processing apparatus to a carrier block of a second substrate processing apparatus;
    heating the substrate in the second substrate processing apparatus with at least one of a heating time and a heating temperature being adjusted, based on a substrate rest time which includes a period of time between a time point at which the carrier is unloaded from the carrier block of the first substrate processing apparatus and a time point at which the carrier is loaded into the carrier block of the second substrate processing apparatus; and
    exposing the substrate, and further heating the substrate and then developing the substrate in the second substrate processing apparatus.

2. The substrate processing method according to claim 1, comprising the step of measuring the substrate rest time which includes a period of time between a time point at which the carrier is unloaded from the carrier block of the first substrate processing apparatus and a time point at which the carrier is loaded into the carrier block of the second substrate processing apparatus.

3. The substrate processing method according to claim 1, the period of time between a time point at which the carrier is unloaded from the carrier block of the first substrate processing apparatus and a time point at which the carrier is loaded into the carrier block of the second substrate processing apparatus, comprising a step of waiting in which the carrier waits on a carrier waiting unit.

4. A substrate processing system comprising:
    a first substrate processing apparatus including a carrier block into which a carrier containing and transporting a substrate is loaded and from which the carrier is unloaded, a resist coating unit in which a resist film is applied onto a substrate taken out from the carrier loaded into the carrier block, and a first heating unit configured to heat the substrate onto which the resist is applied;

a second substrate processing apparatus including a carrier block into which the carrier unloaded from the first substrate processing apparatus is loaded, a second heating unit configured to heat the substrate taken out from the carrier loaded into the carrier block, a third heating unit configured to heat the substrate having been heated in the second heating unit and then exposed, and a developing unit configured to develop the substrate heated in the third heating unit, the second substrate processing apparatus being connected to an exposure apparatus; and a heating adjusting unit configured to adjust at least one of a heating time and a heating temperature of the second heating unit, based on a substrate rest time which includes a period of time between a time point at which the carrier is unloaded from the carrier block of the first substrate processing apparatus and a time point at which the carrier is loaded into the carrier block of the second substrate processing apparatus.

5. The substrate processing system according to claim 4, further comprising a carrier transport mechanism configured to transport the carrier containing the substrate processed in the first substrate processing apparatus, from the carrier block of the first substrate processing apparatus to the carrier block of the second substrate processing apparatus.

6. The substrate processing system according to claim 5, further comprising a carrier waiting unit on which the carrier unloaded from the carrier block of the first substrate processing apparatus is temporarily placed, before the carrier is loaded into the carrier block of the second substrate processing apparatus.

7. The substrate processing system according to claim 6, wherein the second substrate processing apparatus comprises the carrier waiting unit, and a carrier delivery mechanism configured to deliver the carrier between the carrier waiting unit and the carrier block of the second substrate processing apparatus.

8. The substrate processing system according to claim 4, comprising a measuring unit configured to measure the rest time.

9. The substrate processing system according to claim 4, further comprising a carrier waiting unit on which the carrier unloaded from the carrier unloaded from the carrier block of the first substrate processing apparatus is temporarily placed, before the carrier is loaded into the carrier block of the second substrate processing apparatus.

10. The substrate processing system according to claim 9, wherein the second substrate processing apparatus comprises the carrier waiting unit, and a carrier delivery mechanism configured to deliver the carrier waiting unit and the carrier block of the second substrate processing apparatus.

* * * * *